United States Patent [19]
Henschen

[11] Patent Number: 5,288,959
[45] Date of Patent: Feb. 22, 1994

[54] DEVICE FOR ELECTRICALLY INTERCONNECTING OPPOSED CONTACT ARRAYS

[75] Inventor: Homer E. Henschen, Carlisle, Pa.

[73] Assignee: The Whitaker Corporation, Wilmington, Del.

[21] Appl. No.: 55,603

[22] Filed: Apr. 30, 1993

[51] Int. Cl.[5] .......................... H05B 6/10; B23K 1/00
[52] U.S. Cl. ...................................... 219/616; 29/860; 228/180.1; 219/615
[58] Field of Search .................. 219/10.41, 9.5, 10.43, 219/85.11, 85.18, 85.1, 10.75; 29/860, 857; 228/180.1, 180.2, 179

[56] References Cited

U.S. PATENT DOCUMENTS

| | | | |
|---|---|---|---|
| 4,256,945 | 3/1981 | Carter et al. | 219/10.75 |
| 4,623,401 | 11/1986 | Derbyshire et al. | 148/13 |
| 4,626,767 | 12/1986 | Clappier et al. | 323/280 |
| 4,659,912 | 4/1987 | Derbyshire | 219/535 |
| 4,695,713 | 9/1987 | Krumme | 219/553 |
| 4,701,587 | 10/1987 | Carter et al. | 219/10.75 |
| 4,717,817 | 1/1988 | Krumme | 219/553 |
| 4,745,264 | 5/1988 | Carter | 219/553 |
| 4,789,767 | 12/1988 | Doljack | 219/9.5 |
| 4,795,870 | 1/1989 | Krumme | 219/9.5 |
| 4,852,252 | 8/1989 | Ayer | 29/860 |
| 4,987,283 | 1/1991 | Beinhaur et al. | 219/85.11 |
| 4,995,838 | 2/1991 | Ayer et al. | 439/874 |
| 5,032,703 | 7/1991 | Henschen et al. | 219/85.11 |
| 5,059,756 | 10/1991 | Henschen et al. | 219/85.22 |
| 5,064,978 | 11/1991 | Scholz | 219/9.5 |
| 5,098,319 | 3/1992 | McGaffigan et al. | 219/85.11 |

FOREIGN PATENT DOCUMENTS

0241597 10/1987 European Pat. Off. .

*Primary Examiner*—Philip H. Leung
*Attorney, Agent, or Firm*—Katherine A. Nelson

[57] ABSTRACT

A device 10 usable in conjunction with a source of constant amplitude high frequency alternating current of known frequency for providing sufficient thermal energy to melt a fusible electrically conductive material 24 includes an integral member formed from strip 12 of a first metal having a carrier strip section 14 and a plurality of fingers 20 initially integrally coextending therefrom. The carrier strip section 14 further has a thin magnetic layer 18 thereon, transforming the carrier strip into a Curie point heater. The fingers 20 including end portions 22 having layers of solder affixed to opposite sides thereof are adapted to be inserted into apertures 36 defined through a first electrical article 30 from a first surface 32 to a remote surface 34 thereof and adjacent contact pads 40 thereon. The first and second electrical articles 30,46 are placed together with the respective contact pads 40,48 opposed from each other and separated by the finger end portions 22. Upon subjecting the heater body 14 to the constant current of known frequency, the heater body 14 generates and transfers sufficient thermal energy to the finger end portions 22 to melt the fusible material 24 disposed therealong thereby electrically and mechanically interconnecting the arrays of contact pads 40,48. The heater body 14 is then detached from the fingers 20 thereby electrically isolating the interconnections.

7 Claims, 5 Drawing Sheets

DEVICE FOR ELECTRICALLY INTERCONNECTING OPPOSED CONTACT ARRAYS

FIELD OF THE INVENTION

The present invention relates to a device for soldering a first plurality of contact elements to a second plurality of contact elements, and more particularly to a device for soldering opposed arrays of contact elements on two electrical articles.

BACKGROUND OF THE INVENTION

U.S. Pat. No. 4,852,252 discloses providing each of the terminals of a connector with a thin layer of magnetic material along the surface of the nonmagnetic low resistance solder tail of the terminal facing away from the surface to which a wire end will be soldered; in U.S. Pat. No. 4,995,838 a preform of foil having a magnetic layer is disclosed to be soldered to the terminal solder tail's wire-remote surface. The bimetallic structure uses the Curie temperature of the magnetic material to define an article which will generate thermal energy when subjected to radio frequency current of certain frequency for sufficient short length of time until a certain known temperature is achieved, above which the structure is inherently incapable of rising; by selecting the magnetic material and sufficient thickness thereof and selecting an appropriate solder, the temperature achieved can be selected to be higher than the reflow temperature of the solder preform; when the terminal is subjected through induction to RF current of the appropriate frequency, the solder tail will generate heat which will radiate to the solder preform, reflow the solder, and be conducted along the wire and the terminal and radiate further to shrink the tubing and melt the sealant material. The terminal thus includes an integral mechanism for enabling simultaneous soldering and sealing without other application of heat; excess heat is avoided as is the potential of heat damage to remaining portions of the connector or tubing.

Another U.S. Pat. No. 4,789,767 discloses a multipin connector whose contacts have magnetic material layers on portions thereof spaced from the contact sections to be surface mounted to respective traces on the surface of a printed circuit board. An apparatus is disclosed having a coil wound magnetic core having multiple shaped pole pieces in spaced pairs with an air gap therebetween within which the connector is placed during soldering. The pole pieces concentrate flux in the magnetic contact coating upon being placed beside the contact sections to be soldered, to transmit RF current to each of the contacts, generating thermal energy to a known maximum temperature to reflow the solder and join the contact sections to the conductive traces of the printed circuit element.

Such Curie point heating is disclosed in U.S. Pat. Nos. 4,256,945; 4,623,401; 4,659,912; 4,695,713; 4,701,587; 4,717,814; 4,745,264 and European Patent Publication No. 0241,597. When a radio frequency current for example is passed through such a bipartite structure, the current initially is concentrated in the thin high resistance magnetic material layer which causes heating; when the temperature in the magnetic material layer reaches its Curie temperature, it is known that the magnetic permeability of the layer decreases dramatically; the current density profile then expands into the non-magnetic substrate of low resistivity. The thermal energy is then transmitted by conduction to adjacent structure such as wires and solder which act as thermal sinks; since the temperature at thermal sink locations does not rise to the magnetic material's Curie temperature as quickly as at non-sink locations, the current remains concentrated in those portions of the magnetic material layer adjacent the thermal sink locations and is distributed in the low resistance substrate at non-sink locations. It is known that for a given frequency the self-regulating temperature source thus defined achieves and maintains a certain maximum temperature dependent on the particular magnetic material. One source for regenerating radio frequency current such as of 13.56 mHz is disclosed in U.S. Pat. No. 4,626,767.

The conductive substrate can be copper having a magnetic permeability of about one and a resistivity of about 1.72 micro-ohm-centimeters. The magnetic material may be for example a clad coating of nickel iron alloy such as Alloy No. 42 (42% nickel, 58% iron) or Alloy No. 42-6 (42% nickel, 52% iron and 6% chromium). Typical magnetic permeabilities for the magnetic layer range from fifty to about one thousand, and electrical resistivities normally range from twenty to ninety micro-ohm-centimeters as compared to 1.72 for copper; the magnetic material layer can have a Curie temperature selected to be from the range of between about 200° C. to about 500° C., for example. The thickness of the magnetic material layer is typically one to two skin depths; the skin depth is inversely proportional to the square root of the product of the magnetic permeability of the magnetic material and the frequency of the alternating current passing through the two-layer structure. Solders can be tin-lead such as for example Sn 63 reflowable at a temperature of about 183° C. or Sb-5 reflowable at a temperature of about 240° C. Generally it would be desirable to select a Curie temperature of about 15° C. to 75° C. above the solder reflow temperature.

U.S. Pat. No. 5,059,756 discloses a self-regulating temperature heater with thermally conductive extensions that is used to solder a plurality of spaced contacts on one member with a corresponding plurality of contacts on a second member. The contacts on at least one of the members is either at an edge of member such as a circuit board or is along an outer edge of a connector such as surface mount contacts or exposed wires at the edge of a cable or the like. The heater uses a bimetallic structure similar to the ones disclosed in the previously discussed patents.

It is desirable to have a device suitable for use in soldering two-dimensional arrays of contacts between two opposed electrical articles.

It is also desirable to eliminate the need to perform soldering in a process wherein all portions of the articles are subjected to the high temperatures requisite to reflow solder.

SUMMARY OF THE INVENTION

The present invention is directed to a device for providing sufficient thermal energy to melt fusible conductive material, thereby electrically interconnecting aligned contact pads on a surface of a first electrical article to corresponding opposed and aligned contact pads of a second electrical article. The device is useable in conjunction with a source of constant amplitude high frequency alternating current of a known frequency.

The device in accordance with the invention includes an integral member formed from a strip of a first metal and having a carrier strip section and a plurality of fingers initially integrally coextending therefrom, each associated with and spaced to correspond with respective ones of contact pads of a first electrical article. The integral member is formed from a strip of a first metal having a low electrical resistance and minimal magnetic permeability, the first material defining a first layer. A second metal having a high electrical resistance and high magnetic permeability defines a second layer on a major surface of the carrier strip. The second layer is integrally joined to the first layer and has a thickness of at least equal to one skin depth of the second metal, given the known frequency. The carrier strip section thereby defines a heater body.

Each of the fingers includes an end portions that is adapted to be disposed adjacent and physically between corresponding contact pads on the first and second articles. The fingers further include a fusible material on both the upper and lower surfaces thereof. The fingers are adapted to be used with an electrical article having an array of contact pads on a remote surface thereof and a row of apertures defined through the article from a first surface to the remote surface, the apertures being associated with and proximate to respective ones of the contact pads. The fingers of the connecting device are adapted to be inserted through corresponding apertures until the corresponding end portions are adjacent respective ones of the contact pads on the remote surface of the first article. The first article is then aligned with the second article such that the corresponding contact pads of the two articles are opposed from each other but separated by the corresponding finger end portions such that each finger end portion is disposed adjacent and physically between a corresponding pad of the first article and a respective contact pad of the second article. The heater body portion of the device is then subjected to a constant current of known frequency such that the heater body generates and transfers sufficient thermal energy from the heater body to the finger end portions to melt the fusible material disposed thereon, thereby electrically and mechanically interconnecting the finger end portions to the contact pads on the two articles. The heater body can then be detached from the finger end portions whereby the finger end portions remain a permanent part of the electrically conductive connection between the pairs of the contact pads of the two articles.

In one of the embodiments a plurality of devices is used for interconnecting an array of pads on a flexible etched circuit to an array of pads on a more rigid circuit board. Current to the heater body may be conducted directly from a constant amplitude alternating current source or may be induced as eddy currents in the heater body from an appropriately shaped conductor that is interposed between adjacent devices.

Embodiments of the present invention will now be described in detail with reference to the accompanying drawings.

DETAILED DESCRIPTION OF THE DRAWINGS

Figure 1:
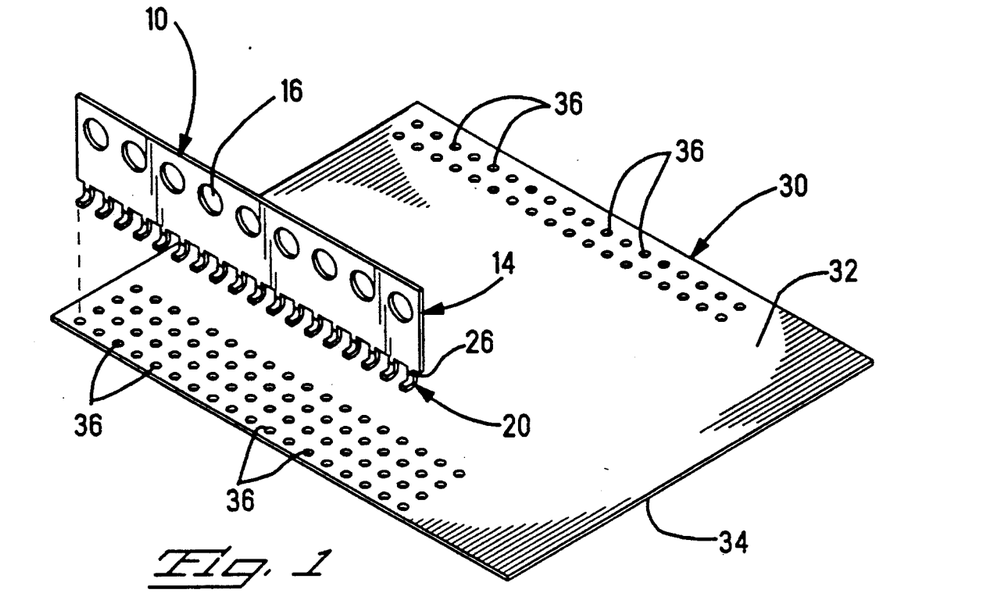
FIG. 1 is a perspective view of the connecting device of the present invention exploded from a first circuit board.
Figure 3:
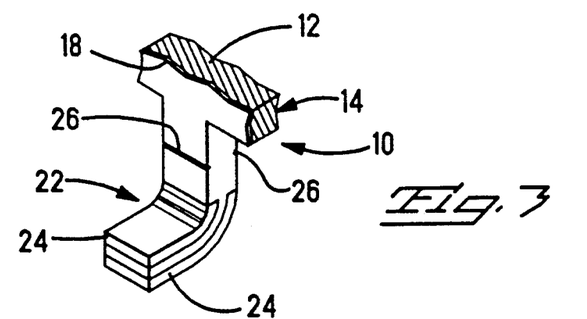
FIG. 3 is an enlarged fragmentary view of the end portion of one of the fingers of the device of FIG. 1.
Figure 5:
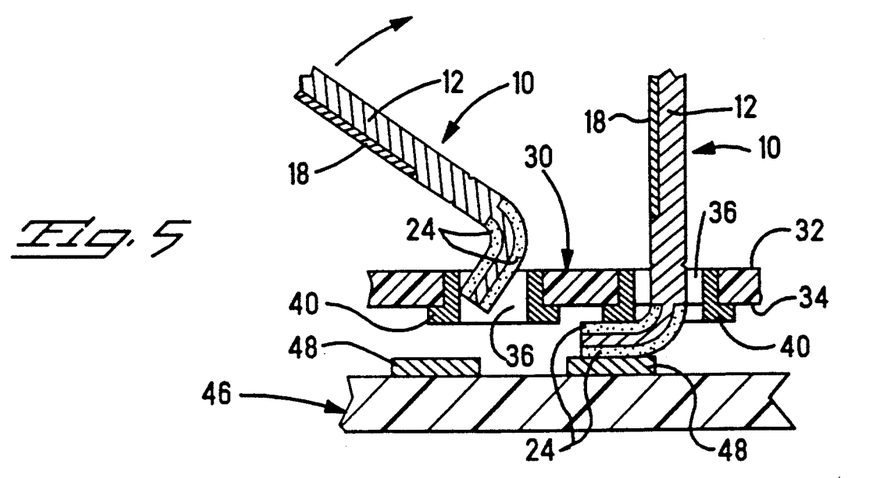
FIG. 5 is a fragmentary sectional view of the circuit board illustrating the steps in inserting the device through the apertures of the circuit board and aligning the device between the contact pads of the first and second articles.

Referring now to FIGS. 1, 3, and 5, the device 10 of the current invention is an integral member formed from a strip 12 of first metal having a carrier strip section 14 and a plurality of fingers 20 initially integrally coextending therefrom. Carrier strip 14 also includes a plurality of pilot holes 16 used for holding and positioning the strip during the manufacturing process. The first metal has a low electrical resistance and minimal magnetic permeability such as a copper, or copper alloy, the first metal defining a first layer. A second metal layer 18 is disposed on the first layer in the carrier strip section and is integrally joined thereto, the second metal having high electrical resistance and high magnetic permeability. Preferably the second layer 18 is incrementally thin and is disposed within a skived recess of the carrier strip 14 as can be seen in FIGS. 3 and 5. As can be seen in FIG. 3, the finger end portions are shown to have a reduced thickness by being skived on both sides of the first material. A fusible electrically conductive material 24 has been disposed in the skived, sections. This material can be solder or other known conductive material. After the magnetic material and solder inlays are defined on the device, the finger end portions are preferably bent around a radius to extend essentially at right angles to the carrier portion. Device 10 may be fabricated from strip stock of a low resistance, low magnetic permeability metal such as copper or a copper alloy, for example phosphor bronze, first layer 12 having a thickness of about 0.008 inches before skiving. Second layer 18 is of a metal which has high magnetic permeability and high resistance, the second layer for example being Alloy No. A-42 of nickel (42%) and iron (58%) and having a thickness of about 0.307 inches or about 1½ to 2 times the thickness of a "skin depth" of the particular metal. Preferably the heater body of the invention is formed as a self regulating heater as described in U.S. Pat. No. 5,059,756. Each finger 20 may have a reduced thickness such as about 0.006 inches after skiving. The solder 24 of the two inlays on finger end portion 22 may be Sn 63 having a reflow temperature of about 183° C., and inlays 24 each may have a thickness of about 0.001 inches. For example when device 10 is used in a grid array having contact pads spaced on 0.100 inch centerllines, fingers 20 may have a width of about 0.035–0.040 inches and are spaced to correspond to the spacing between the contact pads on the electrical articles to be joined therewith.

Figure 4:
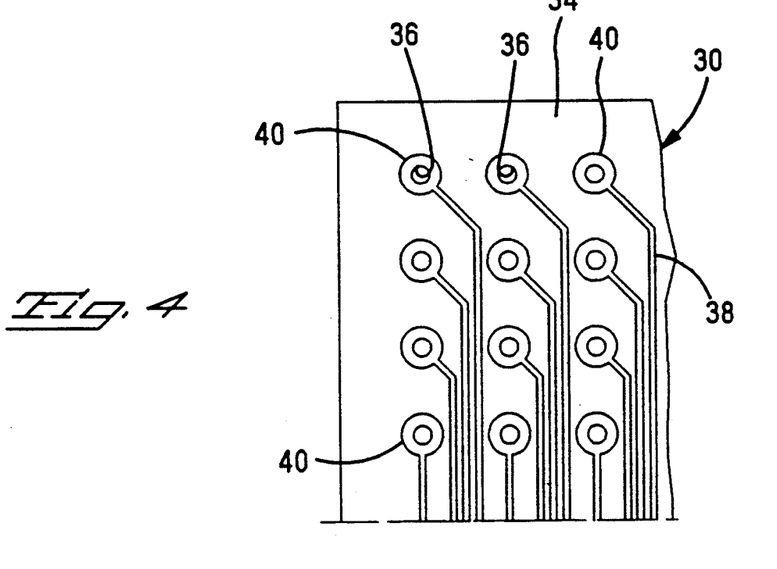
FIG. 4 is a fragmentary portion of the underside of the first circuit board illustrating the conductive traces leading to each of the respective contact pads.

The device 10 as shown is designed to be used with a circuit board 30 having a first surface 32, a remote surface 34 and a plurality of apertures 36 extending therethrough. As can be seen from FIG. 4, the remote surface 34 includes a plurality of conductive traces that extend to each of the respective contact pads, which in turn are adjacent respective apertures 36. While the board 30 is shown as a single layer circuit board, it is understood that the circuit board may be a multi-layer board with circuits having access to contact pads on the remote surface. In a preferred embodiment, the device is for use with flexible circuit and formed of one or more layers of a flexible film having copper traces thereon, the film being made from a material such as a polyimide. One suitable material is available from E. I. duPont de Nemours and Co., Inc under the trade name KAPTON. This present invention is particularly suitable for use with grid arrays on flexible etched circuit (FEC). In a grid array having pads on 0.100 inch centerlines, each pad of the grid may be approximately 0.025" to 0.035" diameter on the undersurface of the FEC. A similar size pad would be provided on the second electrical article. It is to be understood, however, that the invention is not limited to use with flexible circuits.

Figure 2:
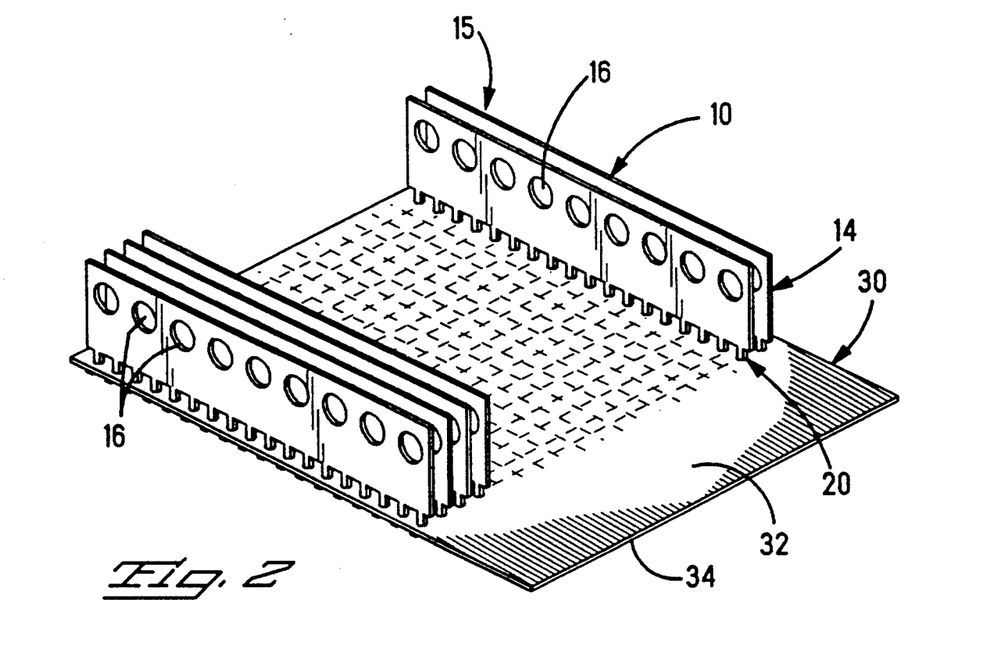
FIG. 2 is a perspective view of a circuit board having an array of devices mounted thereto.

FIG. 5 illustrates the method by which the connecting devices are mounted to the first electrical article 30 shown representively as circuit board 30. As shown in the left hand side of the figure each curved leading end 22 of a leg is first inserted into respective apertures 36 and rotated as indicated by the arrow until the upper surface 24 of the leg 22 lies adjacent a respective contact pad of the board 30 as shown in the right hand side of the figure. FIG. 5 also shows the alignment of the first electrical article with the second electrical article such that inlaid solder portions 24 are disposed between the respective contact pads 40,48 prior to fusing of the solder 24. FIG. 2 shows an array of devices 10 mounted in parallel on board 30. The devices 10 have a length equal to the length of the row of apertures 36 on first electrical article.

Figure 6:
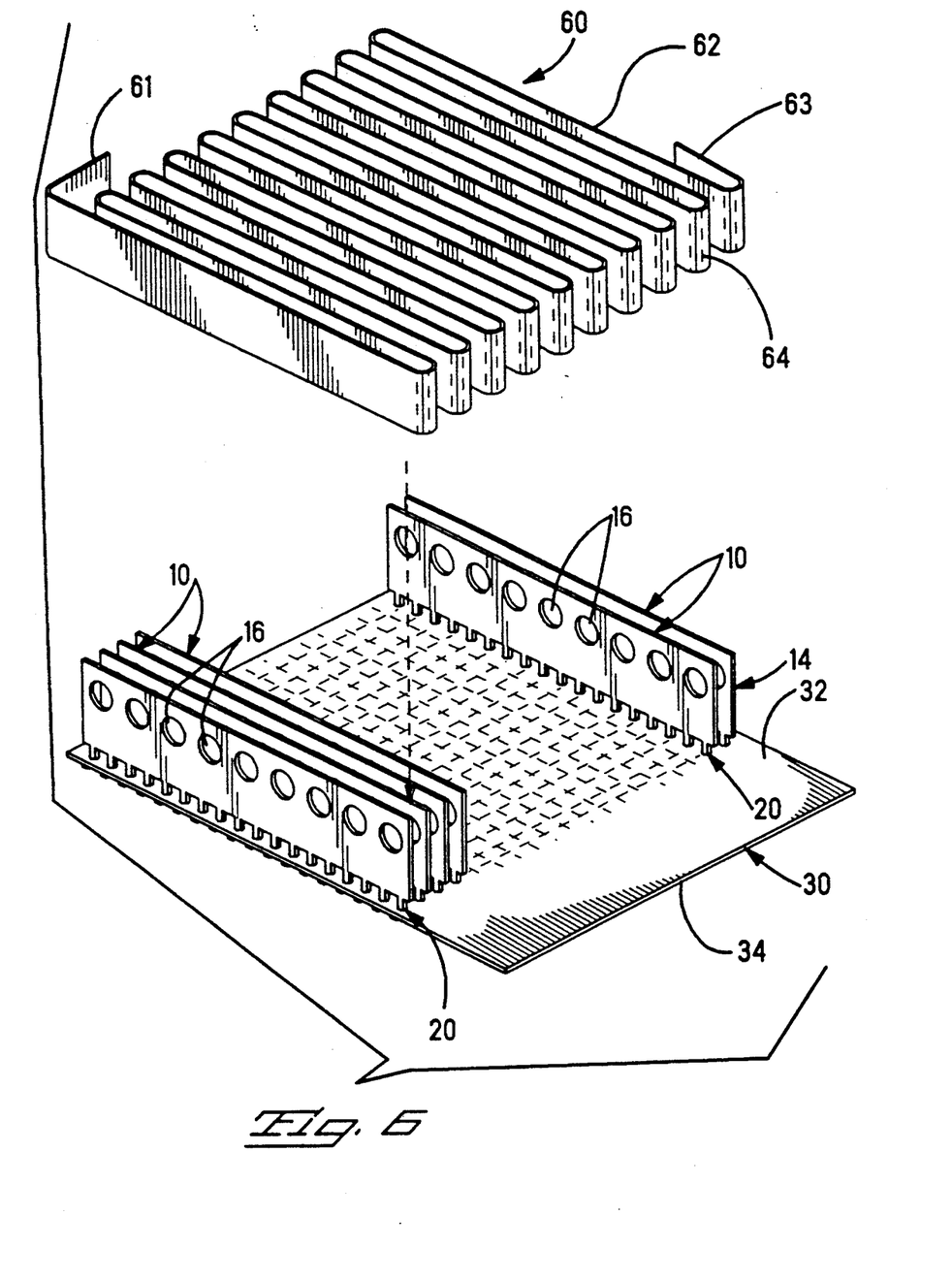
FIG. 6 is an exploded view illustrating a serpentine shaped conductor for use with the array of devices mounted to the circuit board.
Figure 7:
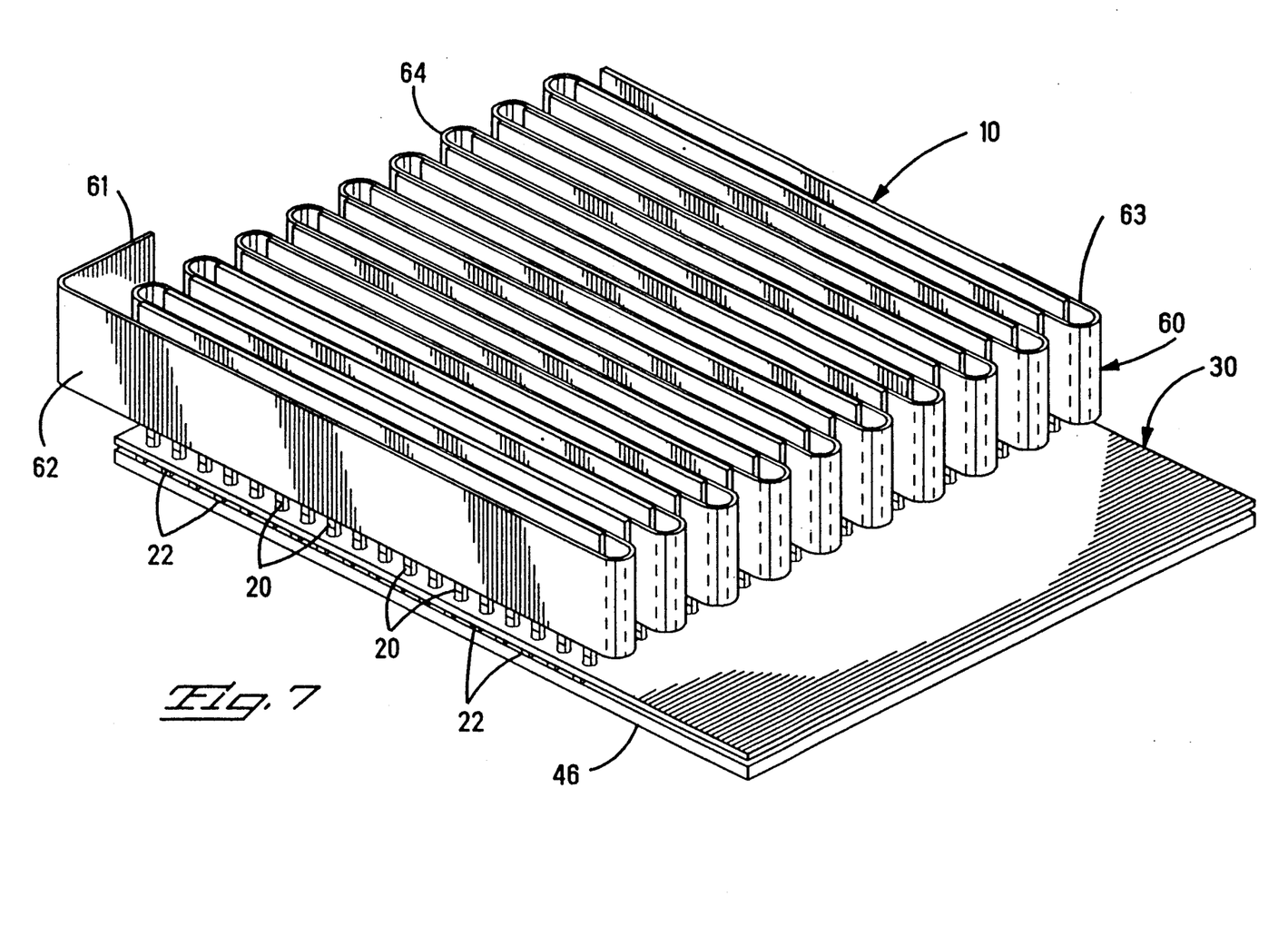
FIG. 7 is a perspective view of the conductor interwoven between the devices on the first circuit board and having the first and second arrays of contact pads aligned for soldering.
Figure 8:
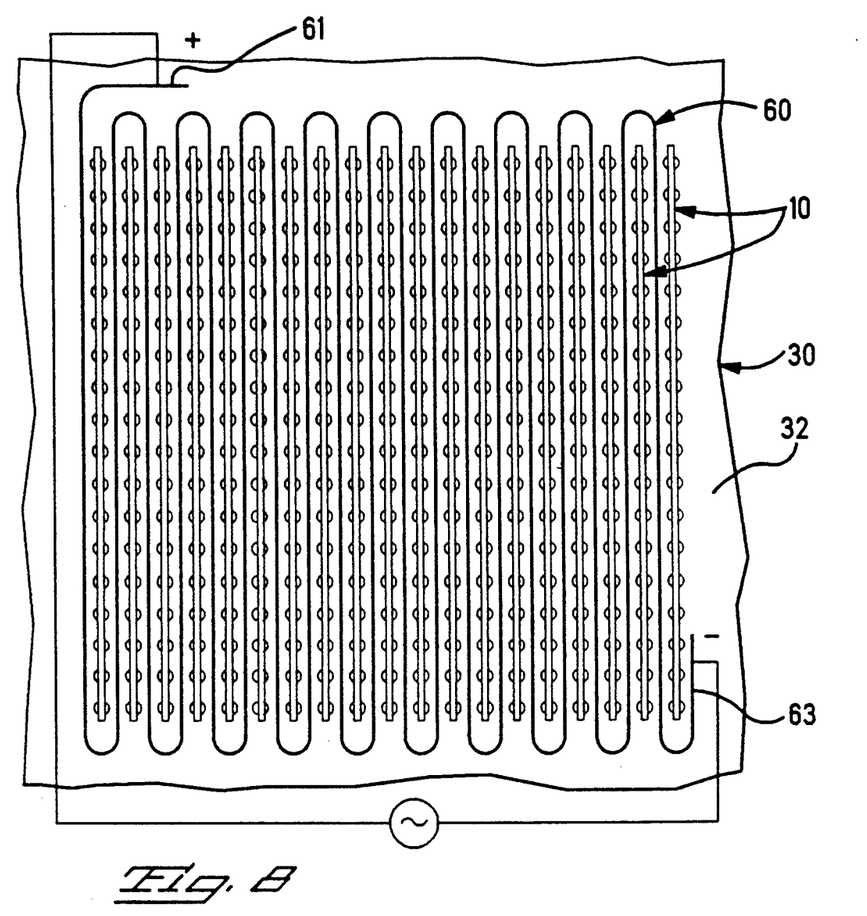
FIG. 8 is a top plan view of the assembly of FIG. 7 connected to the power source.

FIGS. 6, 7, and 8 illustrate one preferred method of supplying heat to the heater bodies or carrier strip 14 by means of a serpentine shaped conductor 60 having electrodes 61,63 at opposed ends thereof, each adapted to be connected to a corresponding electrode of a source of alternating current. FIG. 6 shows a circuit board having an array of devices 10 mounted thereto with the conductor 60 positioned above the array pieces to being interposed among the rows and proximate each of the heater body portions 14 of the devices 10 as shown in FIG. 7. The conductor 60 is of the type disclosed in co-pending U.S. patent applications Ser. No. 08/055,657 filed concomitantly herewith. The conductor body 60 has a continuous array of sections 62 joined by bight portions 64. Each of the section 62 is joined to succeeding ones of the sections 62 by a bight portion 64. The conductor body is shaped so that the sections 62 are configured to be disposed parallel to each other with each of the sections 62 having a length at least as great as the length of the connecting device in the rows of devices of the array. The sections are spaced to correspond to the known spacing between the rows of the array. The conductor is a strip of copper about 0.010 inches thick and 0.125 inches wide.

A source of constant amplitude alternating current is connected across the length of the conductor 60 as shown in FIG. 8 and the resulting primary current through the conductor induces eddy currents in each of the connecting devices 10 such that the heater bodies generate and transfer sufficient thermal energy from the heater body 14 to the end connecting portions 22 to melt the fusible material 24 disposed therealong. The fusing process takes about 10–15 seconds with a maximum temperature reached being that of the Curie temperature of the selected alloy. Thus the end leg portions 22 are electrically and mechanically interconnected between the corresponding circuit pads 40,48 of the first and second electrical articles 30,46.

Figure 9:
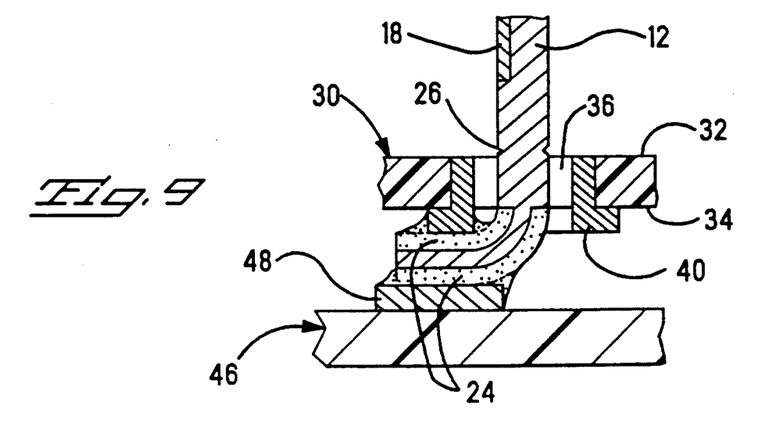
FIG. 9 is an enlarged fragmentary view of an end portion of the device soldered between the two circuit boards.

FIG. 9 illustrates a electrically and mechanical interconnection between the respective contact pads 40,48 and soldered end portion 22.

After soldering has been complete, the source of RF current is removed from conductor 60 and the conductor 60 is removed from the array of devices 10. The carrier strip portions 14 can then be broken off at the scored section 26 thereby leaving the end portions 22 secured between the respective contact pads 40,48 of electrical articles 30 and 46.

While it is to be understood that each of the individual connecting devices 10 can be connected individually to a source of constant amplitude alternating current, the use of a continuous conductor 60 interwoven between rows of an array provides a cost-effective method for terminating all of the connections. During the manufacturing process, the rows of devices 10 may be held in their desired orientation by means of a fixture (not shown). The manufacturing process may be a one or two step procedure. In the two step procedure, the devices 10 are positioned in place on the first electrical article 30 and the conductor 60 is used to induce sufficient eddy currents to lightly fuse the solder 24 to circuit pads 40. The resulting electrical subassembly 15 with the array of devices 10 soldered thereto, as shown in FIG. 2, can then be shipped to an end user who will then apply the sub-assembly 15 to the second electrical article and by means of a conductor 60 or by other means known in the art induce sufficient eddy currents to complete the soldering operation between the two articles and the leg 22.

The present invention further provides a means whereby an array of conductors can be terminated simultaneously without subjecting the device to the temperatures required for solder reflow operations or the like.

It is thought that the connecting device of the present invention and many of its attendant advantages will be understood from the foregoing description. It is apparent that various changes may be made in the form, construction, and arrangement of the parts thereof without departing from the spirit or scope of the invention or sacrificing all of its material advantages.

I claim:

1. A device for providing sufficient thermal energy to melt a fusible electrically conductive material and thereby provide electrically-conductive connections between a plurality of aligned contact pads on a remote surface of a first electrical article to corresponding opposed aligned contact pads of a second electrical article, usable in conjunction with a source of constant amplitude high frequency alternating current of known frequency, said device comprising:

an integral member formed from strip of a first metal having low electrical resistance and minimal magnetic permeability, said integral member defining a first layer having a carrier strip section and a plurality of fingers initially integrally coextending therefrom, each associated with and spaced to correspond with respective ones of said contact pads of said first electrical article;

said carrier strip section having defined on a major surface thereof and integrally joined to said first layer thereof a second layer of a second metal having high electrical resistance and high magnetic permeability, said second layer having a thickness at least equal to one skin depth of said second metal, given said known frequency, said carrier strip section thereby defining a heater body; and each of said fingers including end portions being adapted to be disposed adjacent and physically between a corresponding contact pad of said first article and a respective contact pad of said second article and having fusible electrically conductive material on upper and lower surfaces of each said finger end portion, whereby upon a row of apertures being defined through said first electrical article from a first surface to said remote surface and associated with and proximate to respective ones of said contact pads, and upon inserting respective ones of said fingers through said apertures from said first surface to said remote surface until said finger end portions are adjacent respective ones of said contact pads, and placement of said first and second electrical articles together with said contact pads and corresponding contact pads opposed from each other but separated by said finger end portions, each said finger end portion is disposed adjacent and physically between a corresponding contact pad of said first article and a respective contact pad of said second article, such that upon said heater body being subjected to said constant current of known frequency, said heater body generates and transfers said sufficient thermal energy from said heater body to said finger end portions to melt said fusible material disposed therealong thereby electrically and mechanically interconnecting said finger end portions to both said corresponding and respective contact pads, whereafter said heater body is detached from said fingers along said first surface thereby electrically isolating the interconnections in which the finger end portions remain a permanent part of an electrically-conductive connection between pairs of said contact pads of said first and second electrical articles.

2. The device according to claim 1 wherein said heater body defines a self-regulating temperature heater.

3. The device according to claim 1 wherein the finger end portions are bent substantially at right angles to the carrier strip section.

4. The device according to claim 1 wherein said integral member further includes a frangible section whereby said heater body can be readily detached from said fingers.

5. A subassembly for providing sufficient thermal energy to melt a fusible electrically conductive material and thereby provide electrically-conductive connections between a plurality of aligned contact pads on a remote surface of a first electrical article to corresponding opposed aligned contact pads of a second electrical article, usable in conjunction with a source of constant amplitude high frequency alternating current of known frequency, said subassembly comprising:

a first electrical article having a plurality of rows of contact pads on a remote surface thereof, said first article further including a plurality of rows of apertures extending therethrough from a first surface to said remote surface and associated with and proximate to respective ones of said contact pads;

an array of connecting devices secured to said first electrical article, each said connecting device comprising an integral member formed from strip of a first metal having low electrical resistance and minimal magnetic permeability, said integral member defining a first layer having a carrier strip section and a plurality of fingers initially integrally coextending therefrom, each associated with and spaced to correspond with respective ones of said contact pads in one of said rows of said first electrical article, said carrier strip section having defined on a major surface thereof and integrally joined to said first layer thereof a second layer of a second metal having high electrical resistance and high magnetic permeability, said second layer having a thickness at least equal to one skin depth of said second metal, given said known frequency, said carrier strip section thereby defining a heater body, and each of said fingers including end portions adapted to be inserted through respective ones of said first article apertures and disposed adjacent and physically against a corresponding contact pad of said first article, each finger end portion being secured thereto by subjecting the associated heater body to said constant current of known frequency, thereby generating and transferring said sufficient thermal energy from said heater body to said finger end portions to melt said fusible material disposed therealong thereby electrically and mechanically interconnecting said finger end portions to said first electrical article, whereby upon placement of said first and second electrical articles together with said contact pads and corresponding contact pads opposed from each other but separated by said finger end portions, each said finger end portion is disposed adjacent and physically between a corresponding contact pad of said first article and a respective contact pad of said second article, such that upon said heater bodies again being subjected to said constant current of known frequency, said heater bodies generate and transfer said sufficient thermal energy from said heater body to said finger end portions to melt said fusible material disposed therealong thereby electrically and mechanically interconnecting said finger end portions to both said corresponding and respective contact pads, whereafter said heater body is detached from said fingers along said first surface thereby electrically isolating the interconnections in which the finger end portions remain a permanent part of an electrically-conductive connection between pairs of said contact pads of said first and second electrical articles.

6. The subassembly of claim 5 wherein said heater bodies are self-regulating heaters.

7. A method for making electrically-conductive connections between a plurality of aligned contact pads on a remote surface of a first electrical article to corresponding opposed aligned contact pads of a second electrical article, usable in conjunction with a source of constant amplitude high frequency alternating current of known frequency, the method comprising the steps of:

selecting a first electrical article having a plurality of contact pads on a remote surface thereof;

punching a plurality of apertures extending through said first article from a first surface to said remote surface, each aperture being associated with and proximate to respective ones of said contact pads;

selecting an integral member formed from strip of a first metal having low electrical resistance and minimal magnetic permeability, said integral member defining a first layer having a carrier strip section and a plurality of fingers initially integrally coextending therefrom, each associated with and spaced to correspond with respective ones of said contact pads of said first electrical article, said carrier strip section having defined on a major surface thereof and integrally joined to said first layer thereof a second layer of a second metal having high electrical resistance and high magnetic permeability, said second layer having a thickness at least equal to one skin depth of said second metal, given said known frequency, said carrier strip section thereby defining a heater body, and each of said fingers including end portions having fusible electrically conductive material on upper and lower surfaces thereof, bending said finger end portions such that they are adapted to be disposed adjacent a corresponding contact pad of said first article;

inserting said finger end portions into corresponding first article apertures such that said end portions are disposed adjacent a corresponding contact pad thereof;

placing said first and second electrical articles together with said contact pads and corresponding contact pads opposed from each other but separated by said finger end portions, each said finger end portion being disposed adjacent and physically between a corresponding contact pad of said first article and a respective contact pad of said second article;

subjecting said heater body to said constant current of known frequency whereby said heater body generates and transfers said sufficient thermal energy from said heater body to said finger end portions to melt said fusible material disposed therealong thereby electrically and mechanically interconnecting said finger end portions to both said corresponding and respective contact pads; and detaching said heater body from said fingers along said first surface thereby electrically isolating the interconnections in which the finger end portions remain a permanent part of an electrically-conductive connection between pairs of said contact pads of said first and second electrical articles.

* * * * *